United States Patent
Kadomi et al.

(10) Patent No.: US 9,920,891 B2
(45) Date of Patent: Mar. 20, 2018

(54) WAVELENGTH CONVERSION ELEMENT AND LIGHT SOURCE PROVIDED WITH SAME

(71) Applicant: NIPPON ELECTRIC GLASS CO., LTD., Otsu-shi, Shiga (JP)

(72) Inventors: Masaaki Kadomi, Otsu (JP); Yoshimasa Yamaguchi, Otsu (JP); Takashi Nishimiya, Otsu (JP)

(73) Assignee: NIPPON ELECTRIC GLASS CO., LTD., Shiga (JP)

( * ) Notice: Subject to any disclaimer, the term of this patent is extended or adjusted under 35 U.S.C. 154(b) by 0 days.

(21) Appl. No.: 15/448,651

(22) Filed: Mar. 3, 2017

(65) Prior Publication Data
US 2017/0175958 A1    Jun. 22, 2017

Related U.S. Application Data

(63) Continuation of application No. 13/821,581, filed as application No. PCT/JP2011/073611 on Oct. 14, 2011, now Pat. No. 9,638,396.

(30) Foreign Application Priority Data

Nov. 18, 2010 (JP) .................................. 2010-257923
Nov. 18, 2010 (JP) .................................. 2010-257924
Nov. 30, 2010 (JP) .................................. 2010-265972

(51) Int. Cl.
| | | |
|---|---|---|
| H01L 33/50 | (2010.01) | |
| F21K 9/64 | (2016.01) | |
| C09K 11/08 | (2006.01) | |
| C09K 11/02 | (2006.01) | |
| C03C 14/00 | (2006.01) | |
| F21Y 115/10 | (2016.01) | |
| F21Y 115/30 | (2016.01) | |

(52) U.S. Cl.
CPC .............. *F21K 9/64* (2016.08); *C03C 14/006* (2013.01); *C09K 11/025* (2013.01); *C09K 11/08* (2013.01); *H01L 33/501* (2013.01); *C03C 2214/04* (2013.01); *F21Y 2115/10* (2016.08); *F21Y 2115/30* (2016.08)

(58) Field of Classification Search
CPC .... H01L 33/502–33/507; H01L 27/322; F21K 9/56; G02B 6/0003–6/001; F21V 2200/30
See application file for complete search history.

(56) References Cited

U.S. PATENT DOCUMENTS

2008/0284313 A1* 11/2008 Berben ............... H01L 51/5036
                                                        313/501
2012/0074833 A1*  3/2012 Yuan ..................... H05B 33/14
                                                        313/483

FOREIGN PATENT DOCUMENTS

JP          2008227042 A  *  9/2008

OTHER PUBLICATIONS

Kadomi et al., "Wavelength Conversion Element and Light Source Provided With Same", U.S. Appl. No. 13/821,581, filed Mar. 8, 2013.

* cited by examiner

*Primary Examiner* — Mariceli Santiago
(74) *Attorney, Agent, or Firm* — Keating and Bennett, LLP

(57) ABSTRACT

A light source using a wavelength conversion member is increased in brightness. A wavelength conversion element 11 includes a plurality of wavelength conversion members 12 bundled together, each containing a dispersion medium and phosphor powder dispersed in the dispersion medium.

14 Claims, 7 Drawing Sheets

[FIG. 1]
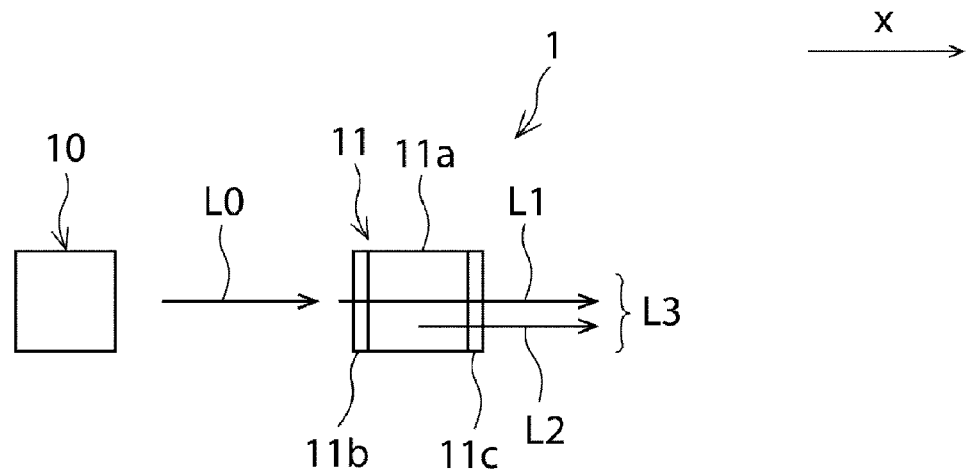
[FIG. 2]
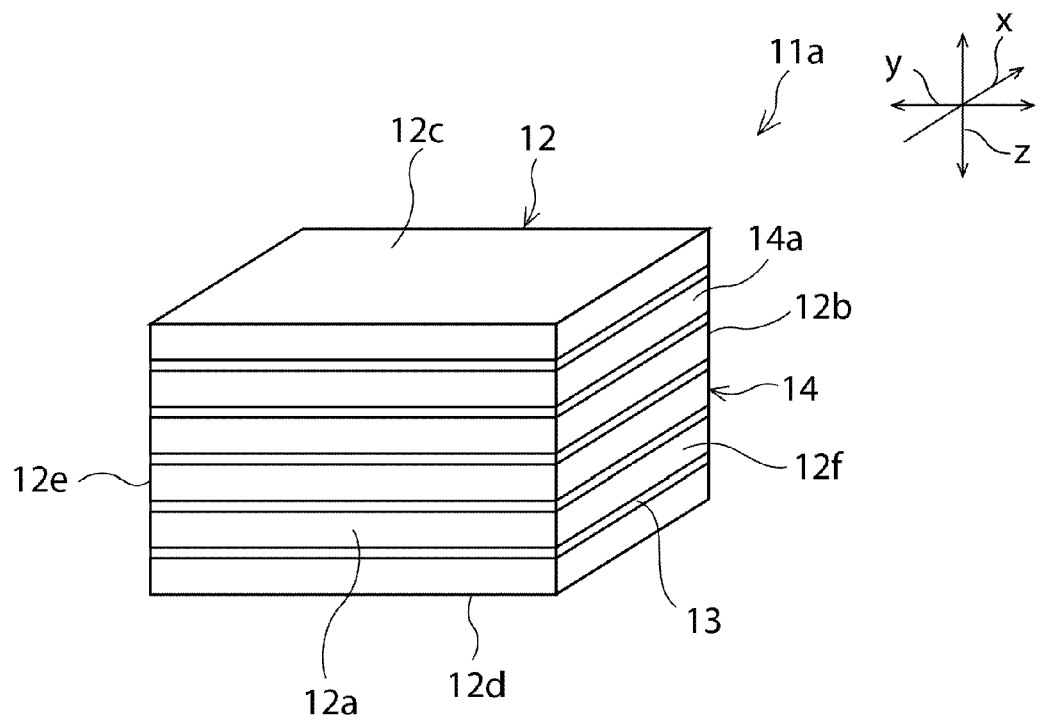

[FIG. 3]
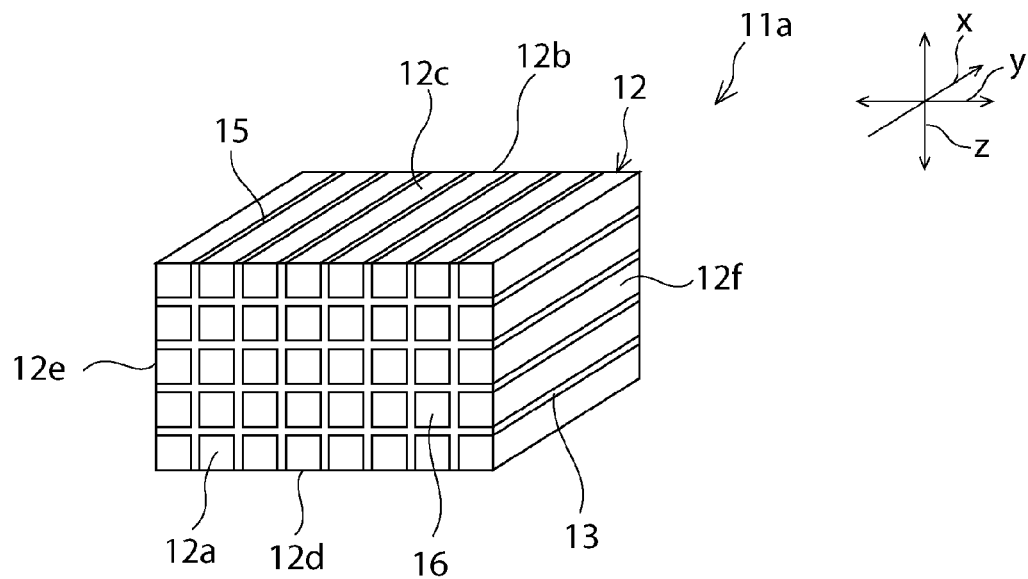
[FIG. 4]
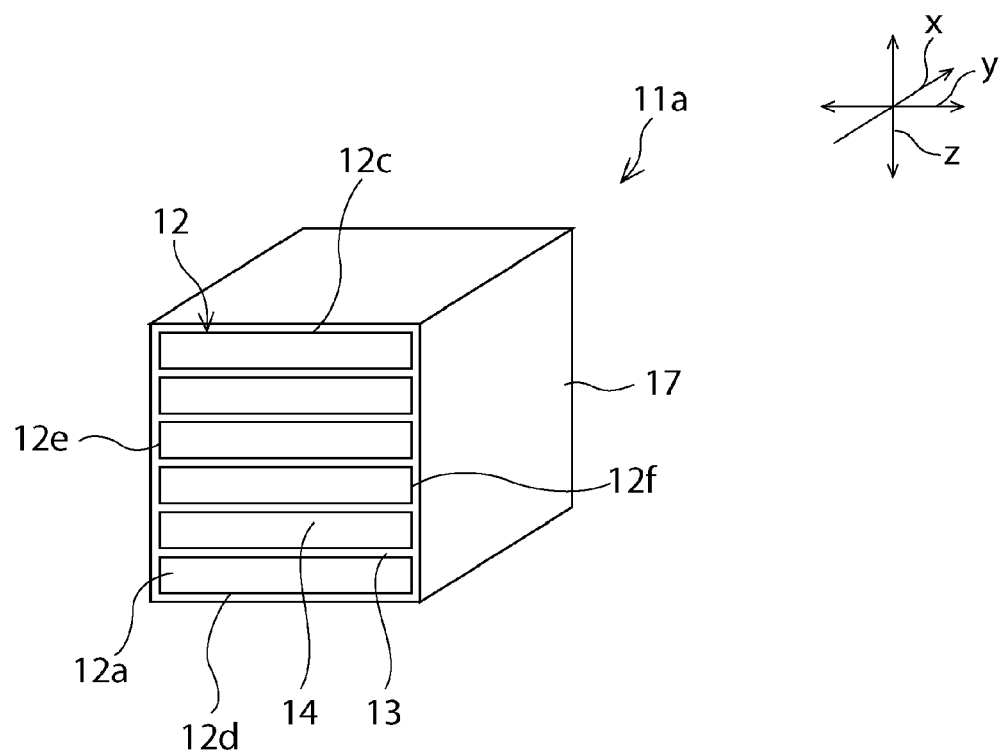

[FIG. 5]
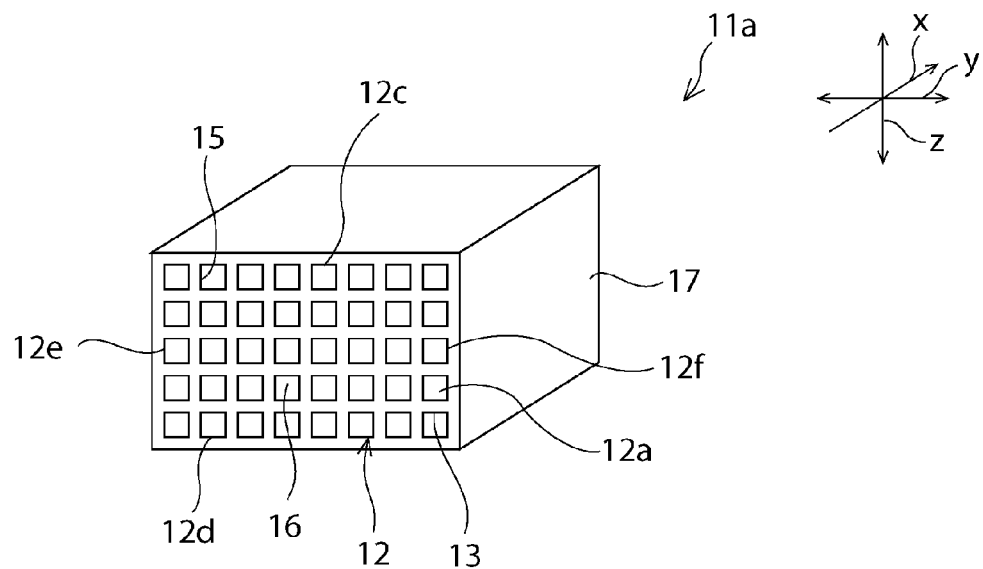
[FIG. 6]
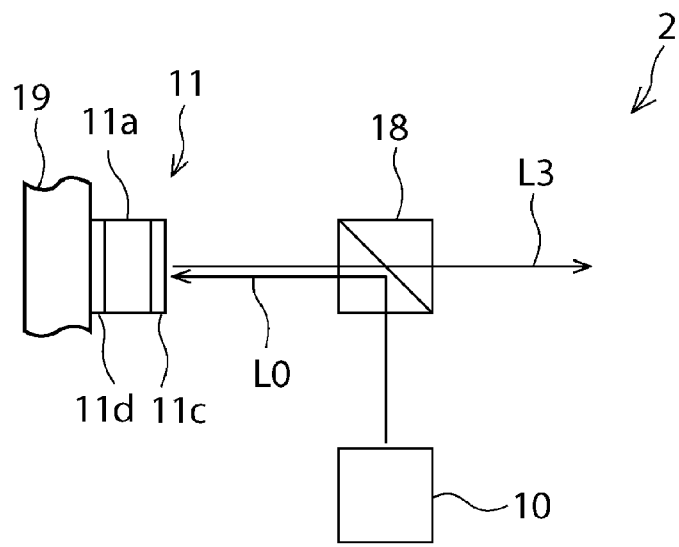

[FIG. 7]
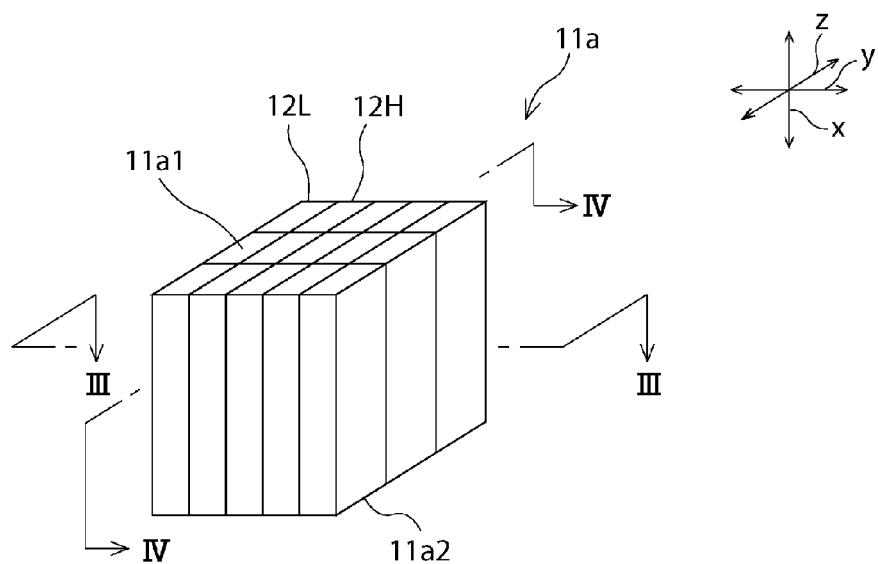
[FIG. 8]
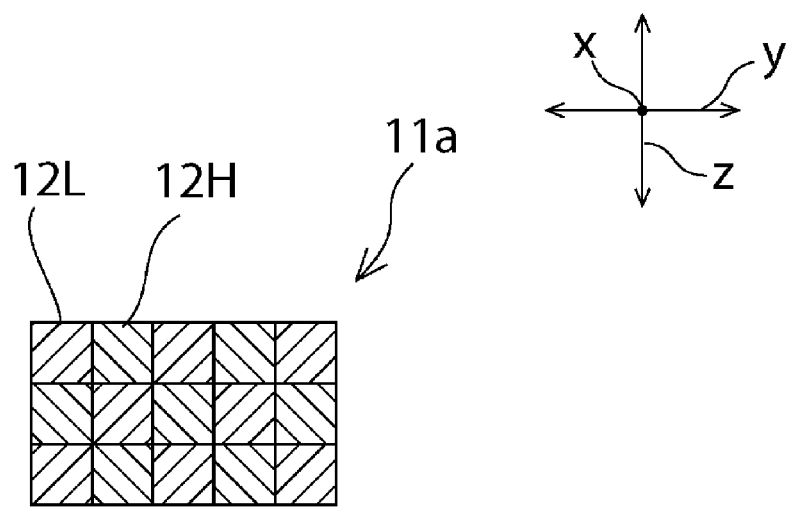

[FIG. 9]
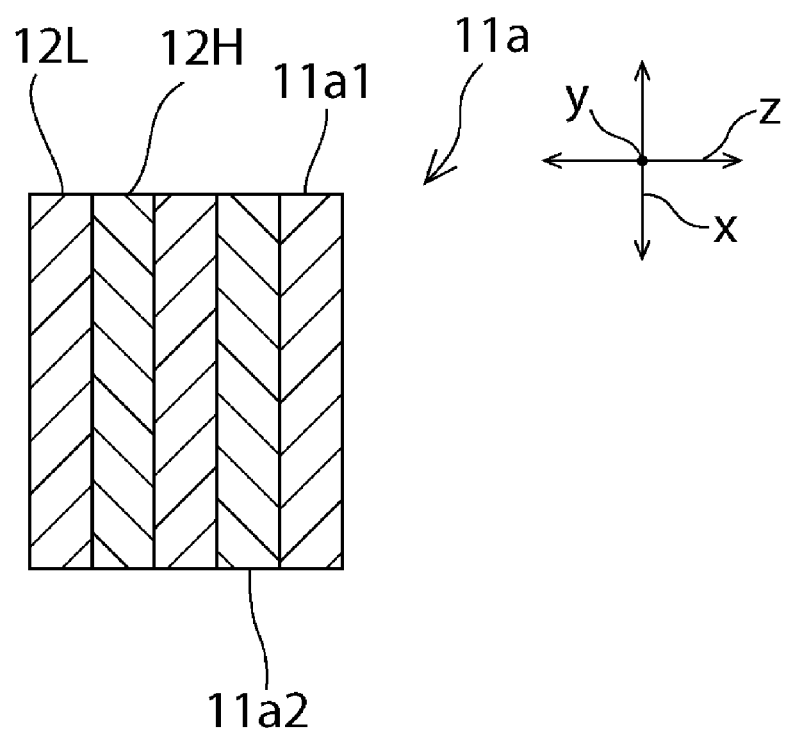
[FIG. 10]
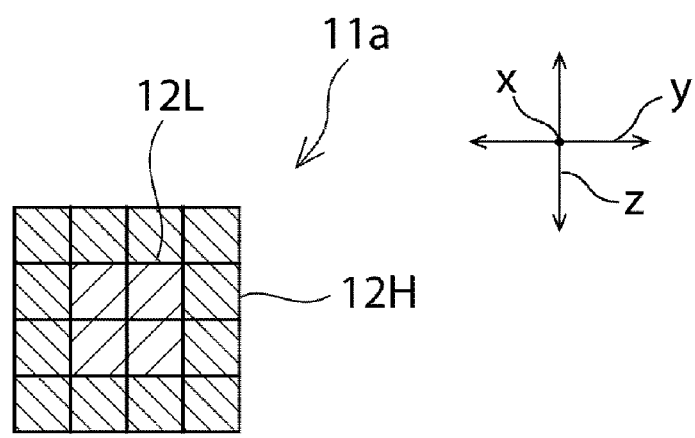

[FIG. 11]
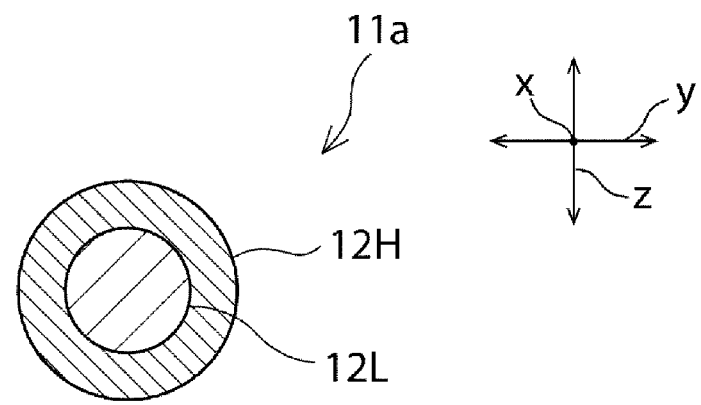
[FIG. 12]
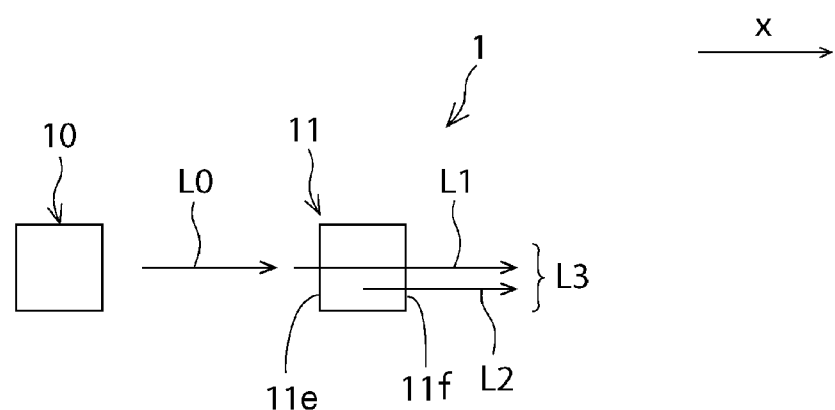

[FIG. 13]
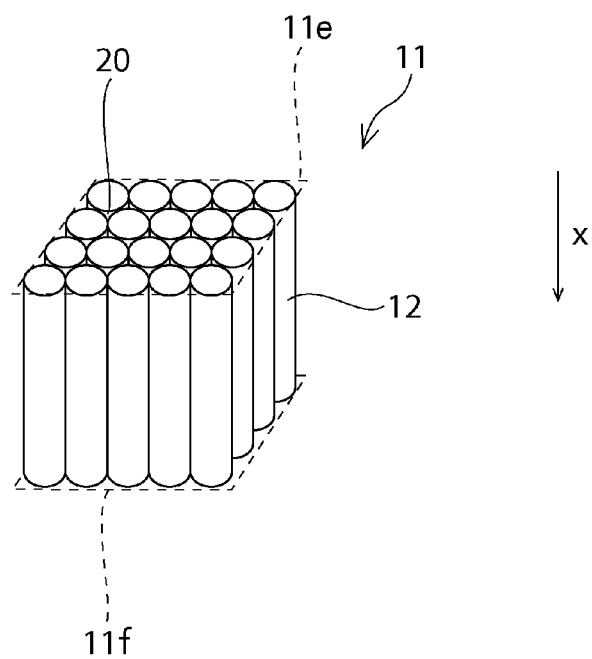

WAVELENGTH CONVERSION ELEMENT AND LIGHT SOURCE PROVIDED WITH SAME

TECHNICAL FIELD

This invention relates to wavelength conversion elements and light sources provided with the same.

BACKGROUND ART

Recently, attention has been increasingly focused on next-generation light sources to replace a fluorescence lamp and an incandescent lamp, such as light sources using a light emitting diode (LED) or a laser diode (LD). For example, Patent Literature 1 below discloses, as an example of such a next-generation light source, a light source in which a wavelength conversion member is disposed on a light exit side of an LED for emitting a blue light and absorbs part of the light from the LED to emit a yellow light. This light source emits a white light which is a synthesized light of the blue light emitted from the LED and the yellow light emitted from the wavelength conversion member.

CITATION LIST

Patent Literature

Patent Literature 1: JP-A-2000-208815

SUMMARY OF INVENTION

Technical Problem

There has been an increasing demand to further increase the brightness of a light source using such a wavelength conversion member described above in recent years.

The present invention has been made in view of the above point and an object thereof is to increase the brightness of a light source using a wavelength conversion member.

Solution to Problem

A first wavelength conversion element according to the present invention includes a plurality of wavelength conversion members bundled together, each of the wavelength conversion members containing a dispersion medium and phosphor powder dispersed in the dispersion medium.

When the wavelength conversion member is made of phosphor powder dispersed in a dispersion medium, light having entered the wavelength conversion member, unlike optical elements made only of glass, is likely to largely scatter inside the wavelength conversion member. Therefore, if the wavelength conversion element is composed of a single wavelength conversion member, part of light inside the wavelength conversion member will leak from the side surfaces of the wavelength conversion member to reduce the intensity of light emitted from the light exit surface.

In contrast, since the first wavelength conversion element according to the present invention includes a plurality of wavelength conversion members bundled together, part of light emitted from a side surface of one wavelength conversion member is reflected at a surface of an adjacent wavelength conversion member. As a result, the reflected light propagates through an air space formed between the adjacent wavelength conversion members or enters again the one wavelength conversion member and propagates therethrough while being reflected thereinside, resulting in emission from a light exit region of the wavelength conversion member where one end thereof is disposed. Therefore, in the first wavelength conversion element according to the present invention, the leakage of light from the side surfaces of the wavelength conversion element can be reduced to increase the intensity of light exiting from the light exit region. Hence, by the use of the first wavelength conversion element according to the present invention, the brightness of the light source can be increased.

A second wavelength conversion element according to the present invention includes a wavelength conversion member and at least two first reflective layers. The wavelength conversion member is made of phosphor powder dispersed in a dispersion medium. The wavelength conversion member has a light entrance surface and a light exit surface opposed to each other in a direction of optical axis. The at least two first reflective layers are formed inside the wavelength conversion member along a plane parallel to the direction of optical axis. The at least two first reflective layers divide the wavelength conversion member into a plurality of sections.

The second wavelength conversion element according to the present invention is provided with the at least two first reflective layers which are formed inside the wavelength conversion member along a plane parallel to the direction of optical axis and divide the wavelength conversion member into a plurality of sections. Therefore, part of light scattered toward the side surfaces is reflected by the reflective layers and effectively prevented from exiting from the side surfaces. Thus, in the second wavelength conversion element according to the present invention, the intensity of light exiting from the light exit surface can be increased. Hence, by the use of the second wavelength conversion element according to the present invention, the brightness of the light source can be increased.

In the second wavelength conversion element according to the present invention, the at least two first reflective layers are preferably formed in parallel with each other. With this configuration, the rectilinear propagation of light emitted from the wavelength conversion element can be improved.

In the second wavelength conversion element according to the present invention, the number of the first reflective layers provided is preferably three or more. With this configuration, the rectilinear propagation of light emitted from the wavelength conversion element can be improved.

The second wavelength conversion element according to the present invention preferably further includes at least two second reflective layers formed inside the wavelength conversion member along a plane parallel to the direction of optical axis and intersecting with the first reflective layers. Thus, wavelength conversion sections extending along the direction of optical axis are preferably defined inside the wavelength conversion member by the first reflective layers and the second reflective layers. With this configuration, the intensity of light exiting from the light exit surface can be further increased. In addition, the rectilinear propagation of light exiting from the light exit surface can be further improved.

In the second wavelength conversion element according to the present invention, the at least two second reflective layers are preferably formed in parallel with each other. With this configuration, the rectilinear propagation of light emitted from the wavelength conversion element can be further improved.

In the second wavelength conversion element according to the present invention, the at least two second reflective layers are preferably orthogonal to the at least two first reflective layers. With this configuration, the rectilinear propagation of light exiting from the light exit surface can be further improved.

In the second wavelength conversion element according to the present invention, it is preferred that the number of the second reflective layers provided be three or more and the wavelength conversion sections be provided in a matrix. With this configuration, the rectilinear propagation of light exiting from the light exit surface can be further improved.

In the second wavelength conversion element according to the present invention, the first reflective layer may be made of, for example, a dielectric multilayer but is preferably made of a metal, an alloy or a white paint. The reason for this is that the first reflective layer made of a metal, an alloy or a white paint has low wavelength dependency of reflectivity and can be easily formed. Likewise, the second reflective layer may be made of, for example, a dielectric multilayer but is preferably made of a metal, an alloy or a white paint. Specific examples of the preferred metal used include, for example, Ag, Al, Au, Pd, Pt, Cu, Ti, Ni, and Cr. Specific examples of the preferred alloy used include alloys containing at least one metal selected from the group consisting of, for example, Ag, Al, Au, Pd, Pt, Cu, Ti, Ni, and Cr. Specific examples of the preferred white paint used include white paints containing particles of at least one metal selected from the group consisting of, for example, Ag, Al, Au, Pd, Pt, Cu, Ti, Ni, and Cr; and white paints containing particles of an alloy containing at least one metal selected from the group.

A third wavelength conversion element according to the present invention has a light entrance surface and a light exit surface opposed to each other in a first direction. The third wavelength conversion element according to the present invention includes a first portion and a second portion. The first portion is made of phosphor powder dispersed in a first dispersion medium. The first portion constitutes a first wavelength conversion portion extending from the light entrance surface to the light exit surface in the first direction. The second portion is provided to extend from the light entrance surface to the light exit surface in the first direction. The second portion is provided in contact with the first portion. The second portion contains a second dispersion medium having a different refractive index from the first dispersion medium.

In the third wavelength conversion element according to the present invention, the second portion containing a second dispersion medium having a different refractive index from the first dispersion medium is provided in contact with the first wavelength conversion portion. Therefore, light inside the first wavelength conversion portion is reflected at a high reflectivity at the interface between the first wavelength conversion portion and the second portion. Thus, the leakage of light from the side surfaces of the wavelength conversion element can be effectively reduced. Therefore, in the third wavelength conversion element according to the present invention, the intensity of light exiting from the light exit surface can be increased. Hence, by the use of the third wavelength conversion element according to the present invention, the brightness of the light source can be increased.

In the third wavelength conversion element according to the present invention, from the viewpoint of more effectively reducing the leakage of light from the side surfaces of the wavelength conversion element to further increase the intensity of light exiting from the light exit surface, the first portion constituting the first wavelength conversion portion is preferably surrounded by the second portion.

In the third wavelength conversion element according to the present invention, the second portion may be made only of the second dispersion medium but, preferably, further contains phosphor powder dispersed in the second dispersion medium and constitutes a second wavelength conversion portion. With this configuration, the proportion of wavelength conversion portions contributing to wavelength conversion in the wavelength conversion element can be increased. Thus, the intensity of light exiting from the light exit surface can be further increased. In this case, it is preferred that the number of the first portions provided and the number of the second portions provided be plural and the plurality of first portions and the plurality of second portions be arranged in a matrix. In this configuration, each first wavelength conversion portion is surrounded by some of the second wavelength conversion portions and each second wavelength conversion portion is surrounded by some of the first wavelength conversion portions. Thus, light having entered each of the first and second wavelength conversion portions and fluorescence produced therein propagate to the light exit surface in a state of confinement to the first or second wavelength conversion portion. Therefore, the intensity of light exiting from the light exit surface can be further increased.

In the third wavelength conversion element according to the present invention, from the viewpoint of further increasing the intensity of light exiting from the light exit surface, the reflectivity difference at the interface between the first and second portions is preferably large. Therefore, the difference between the refractive index of the first dispersion medium and the refractive index of the second dispersion medium is preferably 0.05 or more and more preferably 0.1 or more.

In the first wavelength conversion element according to the present invention, the wavelength conversion members may have a cylindrical shape. In this case, in the first wavelength conversion element according to the present invention, the number of the wavelength conversion members bundled together is preferably three or more. With this configuration, the leakage of light from the side surfaces of the wavelength conversion element can be more effectively reduced to further increase the intensity of light exiting from the light exit region. Therefore, the brightness of the light source can be further increased.

The dispersion medium in the wavelength conversion members preferably has a refractive index of 1.45 or more. In this case, the refractive index difference between each wavelength conversion member and the air space can be large. Thus, the reflectivity at the interface can be large and the angle of reflection can be small, so that the emission of light from the side surfaces of the wavelength conversion members can be reduced. Therefore, the leakage of light from the side surfaces of the wavelength conversion element can be more effectively reduced.

From the viewpoint of more effectively reducing the leakage of light from the side surfaces of the wavelength conversion element, the number of the wavelength conversion members bundled together is preferably nine or more.

In the first to third wavelength conversion elements according to the present invention, no particular limitation is placed on the type of the dispersion medium so long as it can disperse phosphor powder. Specific examples of the preferred dispersion medium used include, for example, resin, glass, and ceramic. Of these, the more preferred dispersion mediums used are inorganic dispersion mediums, such as glass and ceramic. The reason for this is that the use of inorganic dispersion medium can increase the thermal resistance of the wavelength conversion element. Furthermore, for the same reason, the phosphor powder is preferably inorganic phosphor powder.

A light source according to the present invention includes any one of the first to third wavelength conversion elements according to the present invention and a light-emitting element for emitting excitation light of the phosphor powder to an end surface of the wavelength conversion element.

As described so far, in the first to third wavelength conversion elements according to the present invention, the intensity of light exiting from the light exit surface can be increased. Therefore, the light source according to the present invention has high brightness.

Advantageous Effects of Invention

The present invention can increase the brightness of a light source using a wavelength conversion member.

BRIEF DESCRIPTION OF DRAWINGS

FIG. 1 is a schematic view of a light source according to a first embodiment.

FIG. 2 is a schematic perspective view of an element body of a wavelength conversion element in the first embodiment.

FIG. 3 is a schematic perspective view of an element body of a wavelength conversion element in a second embodiment.

FIG. 4 is a schematic perspective view of an element body of a wavelength conversion element in a third embodiment.

FIG. 5 is a schematic perspective view of an element body of a wavelength conversion element in a fourth embodiment.

FIG. 6 is a schematic view of a light source according to a fifth embodiment.

FIG. 7 is a schematic perspective view of an element body of a wavelength conversion element in a sixth embodiment.

FIG. 8 is a schematic cross-sectional view taken along the line III-III in FIG. 7.

FIG. 9 is a schematic cross-sectional view taken along the line IV-IV in FIG. 7.

FIG. 10 is a schematic transverse sectional view of an element body of a wavelength conversion element in a seventh embodiment.

FIG. 11 is a schematic transverse sectional view of an element body of a wavelength conversion element in an eighth embodiment.

FIG. 12 is a schematic view of a light source according to a ninth embodiment.

FIG. 13 is a schematic perspective view of a wavelength conversion element in the ninth embodiment.

DESCRIPTION OF EMBODIMENTS

Hereinafter, a description will be given of an exemplary preferred embodiment for working of the present invention. However, the embodiment below is simply illustrative. The present invention is not at all limited to the following embodiments.

First Embodiment

FIG. 1 is a schematic view of a light source according to a first embodiment. As shown in FIG. 1, the light source 1 includes a wavelength conversion element 11 and a light-emitting element 10. When the wavelength conversion element 11 is irradiated with light L0 emitted from the light-emitting element 10, it emits light L2 having a longer wavelength than the light L0. Furthermore, part of the light L0 transmits through the wavelength conversion element 11. Therefore, the wavelength conversion element 11 emits light L3 which is synthesized light of the transmitted light L1 and the light L2. Hence, the light L3 exiting from the light source 1 depends upon the wavelength and intensity of the light L0 exiting from the light-emitting element 10 and the wavelength and intensity of the light L2 exiting from the wavelength conversion element 11. For example, when the light L0 is a blue light and the light L2 is a yellow light, a white light L3 can be provided.

The light-emitting element 10 is an element for emitting excitation light of phosphor powder described hereinafter to the wavelength conversion element 11. No particular limitation is placed on the type of the light-emitting element 10. The light-emitting element 10 can be formed of, for example, an LED, an LD, an electroluminescent light-emitting element or a plasma light-emitting element. From the viewpoint of increasing the brightness of the light source 1, the light-emitting element 10 is preferably one that emits high-intensity light. From this viewpoint, the light-emitting element 10 is preferably formed of an LED or an LD.

In this embodiment, the wavelength conversion element 11 includes an element body 11a, a wavelength-selective filter layer 11b, and a reflection suppression layer 11c. However, in the present invention, the wavelength-selective filter layer 11b and the reflection suppression layer 11c are not essential. For example, the wavelength conversion element may be formed only of an element body. Alternatively, either wavelength-selective filter layers or reflection suppression layers may be formed on both the light exit surface and the light entrance surface of the element body.

The wavelength-selective filter layer 11b is formed on the light entrance surface of the element body 11a. This wavelength-selective filter layer 11b is a layer for allowing only a specific wavelength range of the light L0 emitted from the light-emitting element 10 to be transmitted therethrough to the element body 11a, inhibiting transmission of the other wavelength ranges of the light L0, and preventing light L2 converted by the element body 11a from exiting from the light entrance surface (light-emitting element 10) side. The wavelength-selective filter layer 11b can be made of, for example, a dielectric multilayer.

On the other hand, the reflection suppression layer 11c is formed on the light exit surface of the element body 11a. This reflection suppression layer 11c is a layer for suppressing the reflection of light exiting from the element body 11a on the light exit surface to increase the rate of emission of light exiting from the element body 11a. The reflection suppression layer 11c can be made of, for example, a dielectric multilayer.

FIG. 2 is a schematic perspective view of the element body 11a. As shown in FIG. 2, the element body 11a includes a wavelength conversion member 12 and a plurality of reflective layers 13. In this embodiment, the wavelength conversion member 12 is formed in a prismatic shape. The wavelength conversion member 12 has a light entrance surface 12a, a light exit surface 12b, and four side surfaces 12c to 12f. The light entrance surface 12a and the light exit surface 12b are opposed to each other in the direction of optical axis (direction x).

The wavelength conversion member 12 contains a dispersion medium and phosphor powder dispersed in the dispersion medium.

The phosphor powder absorbs the light L0 from the light-emitting element 10 and emits the light L2 having a longer wavelength than the light L0. The phosphor powder is preferably inorganic phosphor powder. With the use of inorganic phosphor powder, the wavelength conversion member 12 can be increased in thermal resistance.

Specific examples of inorganic phosphor which produces a blue light upon irradiation with an ultraviolet to near-ultraviolet excitation light having a wavelength of 300 to 440 nm include $Sr_5(PO_4)_3Cl:Eu^{2+}$ and $(Sr,Ba)MgAl_{10}O_{17}:Eu^{2+}$.

Specific examples of inorganic phosphor which produces a green fluorescence (fluorescence having a wavelength of 500 nm to 540 nm) upon irradiation with an ultraviolet to near-ultraviolet excitation light having a wavelength of 300 to 440 nm include $SrAl_2O_4:Eu^{2+}$ and $SrGa_2S_4:Eu^{2+}$.

Specific examples of inorganic phosphor which produces a green fluorescence (fluorescence having a wavelength of 500 nm to 540 nm) upon irradiation with a blue excitation light having a wavelength of 440 to 480 nm include $SrAl_2O_4:Eu^{2+}$ and $SrGa_2S_4:Eu^{2+}$.

A specific example of inorganic phosphor which produces a yellow fluorescence (fluorescence having a wavelength of 540 nm to 595 nm) upon irradiation with an ultraviolet to near-ultraviolet excitation light having a wavelength of 300 to 440 nm is $ZnS:Eu^{2+}$.

A specific example of inorganic phosphor which produces a yellow fluorescence (fluorescence having a wavelength of 540 nm to 595 nm) upon irradiation with a blue excitation light having a wavelength of 440 to 480 nm is $Y_3(Al,Gd)_5O_{12}:Ce^{2+}$.

Specific examples of inorganic phosphor which produces a red fluorescence (fluorescence having a wavelength of 600 nm to 700 nm) upon irradiation with an ultraviolet to near-ultraviolet excitation light having a wavelength of 300 to 440 nm include $Gd_3Ga_4O_{12}:Cr^{3+}$ and $CaGa_2S_4:Mn^{2+}$.

Specific examples of inorganic phosphor which produces a red fluorescence (fluorescence having a wavelength of 600 nm to 700 nm) upon irradiation with a blue excitation light having a wavelength of 440 to 480 nm include $Mg_2TiO_4:Mn^{4+}$ and $K_2SiF_6:Mn^{4+}$.

No particular limitation is placed on the average particle size ($D_{50}$) of the phosphor powder. The average particle size ($D_{50}$) of the phosphor powder is, for example, preferably about 1 to about 50 μm and more preferably about 5 to about 25 μm. If the average particle size ($D_{50}$) of the phosphor powder is too large, the luminescent color may become uneven. On the other hand, if the average particle size ($D_{50}$) of the phosphor powder is too small, the luminescence intensity may decrease.

No particular limitation is placed on the content of the phosphor powder in the wavelength conversion member 12. The content of the phosphor powder in the wavelength conversion member 12 can be appropriately set depending upon the intensity of light emitted from the light-emitting element 10, the luminescence properties of the phosphor powder, the chromaticity of desired light and so on. The content of phosphor powder in the wavelength conversion member 12 can be generally, for example, about 0.01% by mass to about 30% by mass and is preferably 0.05% by mass to 20% by mass and more preferably 0.08% by mass to 15% by mass. If the content of phosphor powder in the wavelength conversion member 12 is too large, the porosity of the wavelength conversion member 12 will be high, which may decrease the luminescence intensity of the light source 1. On the other hand, if the content of phosphor powder in the wavelength conversion member 12 is too small, sufficiently intensive fluorescence may not be able to be obtained.

The dispersion medium is preferably, for example, high-temperature resin, glass or ceramic. Of these, the more preferred dispersion mediums used are inorganic dispersion mediums, such as glass and ceramic, which are particularly high in thermal resistance and less likely to be degraded by the light L0 from the light-emitting element 10.

A specific example of the high-temperature resin is polyimide. Specific examples of the glass include, for example, silicate glasses, borosilicate glasses, phosphate glasses, and borophosphate glasses. Specific examples of the ceramic include, for example, zirconia, alumina, barium titanate, silicon nitride, and metal nitrides, such as titanium nitride.

A plurality of first reflective layers 13 are formed inside the wavelength conversion member 12. In this embodiment, three or more first reflective layers 13 are formed. Each of the plurality of first reflective layers 13 is formed in the shape of a flat sheet. Each of the plurality of first reflective layers 13 is formed to extend along the direction x (direction of optical axis) and the direction y perpendicular to the direction x. In other words, each of the plurality of first reflective layers 13 is formed along a plane parallel to the direction x (direction of optical axis). The plurality of first reflective layers 13 are spaced apart from each other along the direction z perpendicular to each of the direction x and the direction y. In other words, the plurality of first reflective layers 13 are opposed to each other in the direction z. Each of the plurality of first reflective layers 13 is exposed on the light entrance surface 12a, the light exit surface 12b, and the side surfaces 12e and 12f. Therefore, the wavelength conversion member 12 is divided into a plurality of wavelength conversion sections 14 aligned in the direction z.

Although in this embodiment the plurality of first reflective layers 13 are provided in parallel with each other, at least two of the reflective layers may not necessarily be arranged in parallel with each other in the present invention.

The first reflective layers 13 preferably have a high reflectivity to the light L0 from the light-emitting element 10, i.e., excitation light of the phosphor powder, and a high reflectivity to the light (converted light) emitted from the phosphor powder. Specifically, the reflectivity of the reflective layers 13 in each of the excitation wavelength of the phosphor powder and the wavelength of light emitted from the phosphor powder upon irradiation of the phosphor powder with light of excitation wavelength is preferably 60% or more, more preferably 85% or more, and still more preferably 90% or more.

From the viewpoint of achieving such a reflectivity, the reflective layers 13 are preferably made of, for example, metal or alloy. Specifically, the reflective layers 13 are preferably made of a metal, such as Ag, Al, Au, Pd, Pt, Cu, Ti, Ni or Cr, an alloy containing at least one of these metals or a white paint.

When the reflective layer 13 and the wavelength conversion member 12 are made to directly adhere to each other, the reflective layer 13 may not be able to have sufficiently high adhesion strength depending upon the material of the reflective layer 13. Therefore, an adhesion layer may be formed between the reflective layer 13 and the wavelength conversion member 12. The adhesion layer can be made of, for example, aluminum oxide, silicon oxide, chromium oxide or copper oxide.

As described previously, in this embodiment, a plurality of reflective layers 13 are formed inside the wavelength conversion member 12. Therefore, it is possible to reduce the emission of light, which has scattered inside the wavelength conversion member 12 and travels toward the side surfaces 12c and 12d, from the side surfaces 12c and 12d. More specifically, light in some of the plurality of wavelength conversion sections 14, i.e., light in the wavelength conversion sections 14a sandwiched between the reflective layers 13 in the direction z, is reflected by the reflective layers 13 to reduce the emission from the side surfaces 12c and 12d and then exits from the light exit surface 12b. Thus, the light L3 exiting from the light exit surface 12b of the wavelength conversion member 12 can be increased in intensity. As a result, the brightness of the light source 1 can be increased.

Furthermore, since the plurality of reflective layers 13 are provided, the light L3 emitted from the wavelength conversion member 12 can be improved in rectilinear propagation. From the viewpoint of further improving the rectilinear propagation of the light L3, three or more reflective layers 13 should preferably be provided.

In addition, since the plurality of reflective layers 13 are provided, this make it possible to increase the average optical path length of light having entered the wavelength conversion member 12 before the emission thereof from the wavelength conversion member 12. Therefore, the wavelength conversion member 12 can be increased in wavelength conversion efficiency.

No particular limitation is placed on the method for producing the wavelength conversion element 11. The wavelength conversion element 11 can be produced, for example, in the following manner.

First, an element body 11a is produced. Specifically, a sheet member is produced which constitutes a wavelength conversion section and is made of a dispersion medium containing phosphor powder dispersed therein. This sheet member can be produced by, for example, pressing a powder mixture of phosphor powder and glass powder or ceramic powder into shape and firing the pressed mixture powder.

Next, a reflective layer is formed on one surface of the sheet member. The formation of the reflective layer can be implemented by, for example, CVD, sputtering or plating. Alternatively, the reflective layer may be formed by bonding a reflective film to the sheet member using an adhesive or the like.

Next, a plurality of such sheet members having their respective reflective layers formed on one surfaces thereof are stacked and bonded together, resulting in the formation of an element body 11a.

Alternatively, an element body 11a can be produced by, for example, pressing a powder mixture of phosphor powder and glass powder or ceramic powder into a sheet-like green body, applying a paste containing metal microparticles to one surface of the obtained green body, stacking a plurality of such green bodies, and then firing them.

Finally, by forming a wavelength-selective filter layer 11b and a reflection suppression layer 11c such as by sputtering or CVD, a wavelength conversion element 11 can be completed.

Hereinafter, a description will be given of other exemplary preferred embodiments and modifications for working of the present invention. In the following description, elements having substantially the same functions as those in the first embodiment are referred to by the common references and further explanation thereof will be omitted.

Second Embodiment

FIG. 3 is a schematic perspective view of an element body of a wavelength conversion element in a second embodiment.

As shown in FIG. 3, in this embodiment, not only a plurality of first reflective layers 13 but also a plurality of second reflective layers 15 are formed inside a wavelength conversion member 12. Specifically, in this embodiment, three or more second reflective layers 15 are provided. Each of the plurality of second reflective layers 15 is formed to extend in parallel with the direction x (direction of optical axis) and along the direction x and the direction inclined to the direction x (direction intersecting with the first reflective layers 13). In this embodiment, specifically, each of the plurality of second reflective layers 15 is formed to extend along the direction x and the direction z (direction perpendicular to the first reflective layers 13). The plurality of second reflective layers 15 are spaced apart from each other in the direction y. In other words, the plurality of second reflective layers 15 are opposed to each other in the direction y. Each of the plurality of second reflective layers 15 reaches the light entrance surface 12a, the light exit surface 12b, and the side surfaces 12e and 12f. The plurality of second reflective layers 15 and the plurality of first reflective layers 13 define a plurality of prismatic wavelength conversion sections 16 arranged in a matrix. Therefore, in this embodiment, it is possible to reduce not only the leakage of light from the side surfaces 12c and 12d but also the leakage of light from the side surfaces 12e and 12f. Thus, the light L3 exiting from the light exit surface 12b can be further increased in intensity. As a result, the brightness of the light source 1 can be further increased.

Although in this embodiment the plurality of reflective layers 15 are provided in parallel with each other, at least two of the second reflective layers may not necessarily be provided in parallel with each other in the present invention.

No particular limitation is placed on the method for producing the element body 11a in this embodiment. The element body 11a may be produced by, for example, bonding quadrangular prism-shaped wavelength conversion members, each having reflective layers formed on adjacent two of the side surfaces thereof, one after another to form a matrix. Alternatively, the element body 11a may be produced by inserting a plurality of quadrangular prism-shaped wavelength conversion members into a metal folder formed in a lattice-like structure.

Third and Fourth Embodiments

FIG. 4 is a schematic perspective view of an element body of a wavelength conversion element in a third embodiment. FIG. 5 is a schematic perspective view of an element body of a wavelength conversion element in a fourth embodiment.

The first and second embodiments have described examples in which no reflective layer is provided on the side surfaces 12c to 12f of the wavelength conversion member 12. However, the present invention is not limited to these configurations. For example, as shown in FIGS. 4 and 5, reflective layers 17 may be formed on the side surfaces 12c to 12f. Thus, the leakage of light from the side surfaces 12c to 12f can be more effectively reduced. Therefore, the light L3 exiting from the light exit surface 12b can be still further increased in intensity. As a result, the brightness of the light source 1 can be still further increased.

Fifth Embodiment

FIG. 6 is a schematic view of a light source according to a fifth embodiment.

As shown in FIG. 6, a light source 2 of this embodiment is provided with a beam splitter 18. Light L0 from a light-emitting element 10 is guided to a wavelength conversion element 11 by the beam splitter 18. A reflection suppression layer 11c is formed on the light entrance surface of the wavelength conversion element 11, while a reflective layer 11d is formed on the opposite surface thereof. Furthermore, an adhesion layer (not shown) made of resin or solder is formed on the reflective layer 11d so that the wavelength conversion element 11 is secured through the adhesion layer to a substrate 19 made of glass, ceramic, metal or the like. This reflective layer 11d reflects part of the light L0 and the luminescence of the wavelength conversion member 12 toward the beam splitter 18. Therefore, the light L3 is directed toward the beam splitter 18, transmits through the beam splitter 18, and is then emitted outside.

In the case of the light source 2 in which the substrate 19 and the wavelength conversion element 11 are secured to each other through the adhesion layer as shown in FIG. 6, the use of the wavelength conversion element 11 including wavelength conversion sections formed in layers or a matrix as shown in FIG. 2 or 3 can effectively prevent peel-off between the substrate 19 and the wavelength conversion element 11 due to heat produced upon conversion of the light L0 emitted from the light-emitting element 10 to the light L3.

A detailed description will be given below of the present invention with reference to an example and a comparative example. However, the following examples are simply illustrative. The present invention is not at all limited to the following examples.

Example

In this example, a wavelength conversion element having substantially the same structure as the wavelength conversion element 11 in the second embodiment was produced in the following manner.

Specifically, first, 85% by mass borosilicate glass powder and 15% by mass sulfide phosphor powder ($CaGa_2S_4$, fluorescence wavelength: 561 nm) were mixed, the mixture was pressed into shape, fired and then cut to produce a wavelength conversion member having a thickness of 0.3 mm, a width of 0.3 mm, and a depth of 20 mm. A 134 nm-thick layer made of aluminum oxide was formed as an adhesion layer on all the surfaces of the wavelength conversion member by vacuum vapor deposition. Next, a 150 nm-thick reflective layer made of Ag was formed on the adhesion layer by sputtering. Next, a plurality of such wavelength conversion members each having an adhesion layer and a reflective layer formed thereon were stacked and bonded together using an epoxy resin adhesive, and the stack was cut and polished to produce a matrix-like element body 2.1 mm square and 0.5 mm deep.

Next, silicon oxide layers and tantalum oxide layers were alternately formed, by vacuum vapor deposition, on the light entrance surface of the element body to give a total of 39 layers, resulting in the formation of a wavelength-selective filter layer. On the other hand, silicon oxide layers and tantalum oxide layers were alternately formed, by vacuum vapor deposition, on the light exit surface of the element body to give a total of four layers, resulting in the formation of a reflection suppression layer. As a result of the above steps, a wavelength conversion element was completed.

The light entrance surface of the produced wavelength conversion element was irradiated with light having a wavelength of 460 nm using an LD and the light emitted from the light exit surface thereof was measured in terms of intensity through a 1 mm square slit. As a result, the intensity of light emitted from the wavelength conversion element of this example was 102 lm.

Comparative Example

Wavelength conversion members 2.1 mm square and 0.5 mm deep were produced in the same manner as in the above example, except that neither adhesion layer nor reflective layer was formed on the surfaces of the wavelength conversion members. The resultant product was used as a wavelength conversion element and evaluated in the same manner as in the example. As a result, the intensity of light emitted from the wavelength conversion element of this comparative example was 83 lm.

These results show that the provision of at least two opposed reflective layers inside the wavelength conversion member enables increased intensity of light emitted from the light exit surface of the wavelength conversion element.

Sixth Embodiment

FIG. 7 is a schematic perspective view of an element body 11a in a sixth embodiment. FIG. 8 is a schematic cross-sectional view taken along the line III-III in FIG. 7. FIG. 9 is a schematic cross-sectional view taken along the line IV-IV in FIG. 7. As shown in FIGS. 7 to 9, the element body 11a includes a plurality of first wavelength conversion portions 12L and a plurality of second wavelength conversion portions 12H. Each of the first and second wavelength conversion portions 12L and 12H contains a dispersion medium and phosphor powder dispersed in the dispersion medium.

The phosphor powder absorbs the light L0 from the light-emitting element 10 and emits the light L2 having a longer wavelength than the light L0. The kinds of phosphor powder that can be used are the same as those in the first embodiment.

No particular limitation is placed on the content of the phosphor powder in each of the first and second wavelength conversion portions 12L and 12H. The content of the phosphor powder in each of the first and second wavelength conversion portions 12L and 12H can be appropriately set depending upon the intensity of light emitted from the light-emitting element 10, the luminescence properties of the phosphor powder, the chromaticity of desired light and so on. The content of phosphor powder in each of the first and second wavelength conversion portions 12L and 12H can be generally, for example, about 0.01% by mass to about 30% by mass and is preferably 0.05% by mass to 20% by mass and more preferably 0.08% by mass to 15% by mass. If the content of phosphor powder in each of the first and second wavelength conversion portions 12L and 12H is too large, the porosity of each of the first and second wavelength conversion portions 12L and 12H will be high, which may decrease the luminescence intensity of the light source 1. On the other hand, if the content of phosphor powder in each of the first and second wavelength conversion portions 12L and 12H is too small, sufficiently intensive fluorescence may not be able to be obtained.

The first wavelength conversion portion 12L and the second wavelength conversion portion 12H may have the same kind of phosphor powder or may have different kinds of phosphor powder. Furthermore, the first wavelength conversion portion 12L and the second wavelength conversion portion 12H may be equal to each other in average particle size ($D_{50}$) and content of the phosphor powder or may be different from each other in at least one of them.

The dispersion mediums that can be used are the same as those in the first embodiment.

A specific example of the high-temperature resin is polyimide. Specific examples of the glass include, for example, silicate glasses, borosilicate glasses, phosphate glasses, and borophosphate glasses. Specific examples of the ceramic include, for example, zirconia, alumina, barium titanate, silicon nitride, and metal nitrides, such as titanium nitride.

In this embodiment, the refractive index of the dispersion medium in the first wavelength conversion portion 12L is different from that of the dispersion medium in the second wavelength conversion portion 12H. Specifically, the refractive index of the dispersion medium in the first wavelength conversion portion 12L is different, in terms of each of the wavelengths of light L0 and light L2, from the refractive index of the dispersion medium in the second wavelength conversion portion 12H. More specifically, the refractive index of the dispersion medium in the first wavelength conversion portion 12L is lower, in terms of each of the wavelengths of light L0 and light L2, than the refractive index of the dispersion medium in the second wavelength conversion portion 12H. The difference between the refractive index of the dispersion medium in the first wavelength conversion portion 12L and the refractive index of the dispersion medium in the second wavelength conversion portion 12H is, in terms of each of the wavelengths of light L0 and light L2, preferably 0.05 or more and more preferably 0.1 or more.

In this embodiment, each of the first and second wavelength conversion portions 12L and 12H is formed in the shape of a quadrangular prism. The plurality of first and second wavelength conversion portions 12L and 12H are arranged in a matrix along the direction y and direction z. Specifically, the plurality of first and second wavelength conversion portions 12L and 12H are arranged in a matrix so that they are located alternately in each of the direction y and direction z. Therefore, each of the first and second wavelength conversion portions 12L and 12H is surrounded by some of the second or first wavelength conversion portions 12H or 12L. Specifically, the side surfaces of each of the first and second wavelength conversion portions 12L and 12H are in contact with some of the second or first wavelength conversion portions 12H or 12L.

Each of the first and second wavelength conversion portions 12L and 12H is provided to extend from the light entrance surface 11a1 to the light exit surface 11a2 in the direction x.

The adjacent first and second wavelength conversion portions 12L and 12H may be, for example, directly joined together by fusion bonding or bonded together by an adhesive or the like. Alternatively, the adjacent first and second wavelength conversion portions 12L and 12H may be fixed using a fixing member, such as a frame.

As described above, in this embodiment, the first and second wavelength conversion portions 12L and 12H having different refractive indices are provided in contact with each other. Therefore, light inside each first wavelength conversion portion 12L is reflected at a high reflectivity at the interfaces with the second wavelength conversion portions 12H. Light inside each second wavelength conversion portion 12H is likewise reflected at a high reflectivity at the interfaces with the first wavelength conversion portions 12L and light incident on the interfaces at a large angle is totally reflected. Thus, the leakage of light from the side surfaces of the element body 11a can be effectively reduced. Therefore, the intensity of light L3 emitted from the light exit surface 11a2 of the element body 11a can be increased. As a result, a high-brightness light source 1 can be provided.

In this embodiment, each first wavelength conversion portion 12L is surrounded by some of the second wavelength conversion portions 12H and each second wavelength conversion portion 12H is surrounded by some of the first wavelength conversion portions 12L. Thus, the leakage of light from the side surfaces of the element body 11a can be more effectively reduced. Therefore, the intensity of light L3 emitted from the light exit surface 11a2 of the element body 11a can be further increased.

In addition, since the element body 11a is formed of the first and second wavelength conversion members 12L and 12H, the rectilinear propagation of the light L3 can be improved.

From the viewpoint of further increasing the intensity of light L3 emitted from the light exit surface 11a2 of the element body 11a, the light reflectivity at the interface between the first wavelength conversion portion 12L and the second wavelength conversion portion 12H should preferably be further increased. Therefore, the difference between the refractive index of the dispersion medium in the first wavelength conversion portion 12L the refractive index of the first wavelength conversion portion 12L) and the refractive index of the dispersion medium in the second wavelength conversion portion 12H the refractive index of the second wavelength conversion portion 12H) is preferably 0.05 or more and more preferably 0.1 or more.

This embodiment has described an example in which the element body 11a is formed of a plurality of first wavelength conversion portions 12L and a plurality of second wavelength conversion portions 12H. However, the present invention is not limited to this configuration. Only one of the two types of wavelength conversion portions 12L and 12H, i.e., the first and second wavelength conversion portions 12L and 12H, may be provided and, instead of the other type of wavelength conversion portions 12L or 12H, portions made from a dispersion medium having a different refractive index from the dispersion medium in the one type of wavelength conversion portions 12L or 12H may be provided. Also in this case, the leakage of light from the side surfaces of the element body 11a can be effectively reduced. However, from the viewpoint of increasing the proportion of wavelength conversion portions having the wavelength conversion function in the element body 11a to increase the intensity of light L3 emitted from the light exit surface 11a2, the element body 11a should preferably be formed of a plurality of first wavelength conversion portions 12L and a plurality of second wavelength conversion portions 12H.

Seventh and Eighth Embodiments

FIG. 10 is a schematic transverse sectional view of an element body of a wavelength conversion element in a seventh embodiment. FIG. 11 is a schematic transverse sectional view of an element body of a wavelength conversion element in an eighth embodiment.

The sixth embodiment has described an example in which a plurality of first wavelength conversion portions 12L and a plurality of second wavelength conversion portions 12H are alternately arranged in a matrix. However, the present invention is not limited to this configuration. For example, as shown in FIGS. 10 and 11, a single or plurality of first wavelength conversion portions 12L may be surrounded by a single or plurality of second wavelength conversion portions 12H. In this case, the leakage of light inside the single or plurality of first wavelength conversion portions 12L to the outside can be effectively reduced. Therefore, like the sixth embodiment, the intensity of light L3 emitted from the light exit surface 11a2 can be increased to increase the brightness of the light source.

Furthermore, the sixth embodiment has described an example in which each of the first and second wavelength conversion portions 12L and 12H has the shape of a quadrangular prism. However, the present invention is not limited to this configuration. The first and second wavelength conversion portions may be in the shape of, for example, a polygonal prism or a triangular prism. Alternatively, as shown in FIG. 11, the first wavelength conversion portion 12L may be in the shape of a cylindrical column and the second wavelength conversion portion 12H may be in the shape of a cylindrical tube.

The wavelength conversion elements according to the sixth to eighth embodiments may be used as the wavelength conversion element in the light source 2 shown in FIG. 6.

Ninth Embodiment

FIG. 12 is a schematic view of a light source according to this embodiment. As shown in FIG. 12, the light source 1 includes a wavelength conversion element 11 and a light-emitting element 10. When the wavelength conversion element 11 is irradiated with light L0 emitted from the light-emitting element 10, it emits light L2 having a longer wavelength than the light L0. Furthermore, part of the light L0 transmits through the wavelength conversion element 11. Therefore, the wavelength conversion element 11 emits light L3 which is synthesized light of the transmitted light L1 and the light L2. Hence, the light L3 exiting from the light source 1 depends upon the wavelength and intensity of the light L0 exiting from the light-emitting element 10 and the wavelength and intensity of the light L2 exiting from the wavelength conversion element 11. For example, when the light L0 is a blue light and the light L2 is a yellow light, a white light L3 can be provided.

The light-emitting element 10 is an element for emitting excitation light of phosphor powder described hereinafter to the wavelength conversion element 11. No particular limitation is placed on the type of the light-emitting element 10. The light-emitting element 10 can be formed of, for example, an LED, an LD, an electroluminescent light-emitting element or a plasma light-emitting element. From the viewpoint of increasing the brightness of the light source 1, the light-emitting element 10 is preferably one that emits high-intensity light. From this viewpoint, the light-emitting element 10 is preferably formed of an LED or an LD.

A wavelength-selective filter layer or a reflection suppression layer may be formed on at least one of a light entrance region 11e and a light exit region 11f of the wavelength conversion member.

For example, if a wavelength-selective filter layer is formed on the light entrance region 11e of the wavelength conversion element 11, only a specific wavelength range of the light L0 emitted from the light-emitting element 10 can be allowed to transmit through the wavelength conversion element 11. Concurrently, the other wavelength ranges thereof can be prevented from transmitting through the wavelength conversion element 11 and the light L2 converted by the wavelength conversion element 11 can be prevented from exiting from the light entrance region 11e. The wavelength-selective filter layer can be made of, for example, a dielectric multilayer.

Furthermore, for example, if a reflection suppression layer is formed on the light exit region 11f of the wavelength conversion element 11, the reflection of light exiting from the wavelength conversion element 11 on the light exit region 11f can be suppressed to increase the rate of emission of light exiting from the wavelength conversion element 11. The reflection suppression layer can be made of, for example, a dielectric multilayer.

FIG. 13 is a schematic perspective view of the wavelength conversion element 11. As shown in FIG. 13, the wavelength conversion element 11 includes three or more wavelength conversion members 12 arranged to extend along the direction x. The wavelength conversion element 11 preferably includes nine or more wavelength conversion members 12 and more preferably includes 25 or more wavelength conversion members 12. The three or more wavelength conversion members 12 are bundled and fixed together so that each adjacent pair of them are brought into contact with each other. In this embodiment, the wavelength conversion members 12 are formed in a cylindrical shape. Therefore, air spaces 20 are formed between adjacent wavelength conversion members 12 to extend from the light entrance region 11e to light exit region 11f of the wavelength conversion element 11 in the direction x. Each of the light entrance region 11e and the light exit region 11f is composed of the air spaces 20 and end surfaces of the wavelength conversion members 12.

The plurality of wavelength conversion members 12 may be fixed together using a fixing member, such as a frame, or fixed using an adhesive or the like.

The wavelength conversion member 12 contains a dispersion medium and phosphor powder dispersed in the dispersion medium.

The phosphor powder absorbs the light L0 from the light-emitting element 10 and emits the light L2 having a longer wavelength than the light L0. The kinds of phosphor powder that can be used are the same as those in the first embodiment.

No particular limitation is placed on the content of the phosphor powder in the wavelength conversion member 12. The content of the phosphor powder in the wavelength conversion member 12 can be appropriately set depending upon the intensity of light emitted from the light-emitting element 10, the luminescence properties of the phosphor powder, the chromaticity of desired light and so on. The content of phosphor powder in the wavelength conversion member 12 can be generally, for example, about 0.01% by mass to about 30% by mass and is preferably 0.05% by mass to 20% by mass and more preferably 0.08% by mass to 15% by mass. If the content of phosphor powder in the wavelength conversion member 12 is too large, the porosity of the wavelength conversion member 12 will be high, which may decrease the luminescence intensity of the light source 1. On the other hand, if the content of phosphor powder in the wavelength conversion member 12 is too small, sufficiently intensive fluorescence may not be able to be obtained.

The dispersion mediums that can be used are the same as those in the first embodiment.

A specific example of the high-temperature resin is polyimide. Specific examples of the glass include, for example, silicate glasses, borosilicate glasses, phosphate glasses, and borophosphate glasses. Specific examples of the ceramic include, for example, zirconia, alumina, barium titanate, silicon nitride, and metal nitrides, such as titanium nitride.

As described previously, in this embodiment, three or more cylindrical wavelength conversion members 12 are bundled together. Therefore, air spaces 20 are formed between wavelength conversion members 12 to extend from the light entrance region 11e to light exit region 11f. Thus, part of light emitted from a side surface of one wavelength conversion member 12 is reflected at a surface of an adjacent wavelength conversion member 12. As a result, the reflected light propagates through an air space 20 or enters again and propagates through the one wavelength conversion member 12 and then exits from the light exit region 11f of the wavelength conversion member 12. Therefore, the leakage of light from the side surfaces of the wavelength conversion element 11 can be reduced to increase the intensity of light emitted from the light exit region 11f. Hence, a high-brightness light source 1 can be provided.

Furthermore, from the viewpoint of more effectively reducing the leakage of light from the side surfaces of the wavelength conversion element 11, the number of bundled wavelength conversion members 12 is preferably increased to increase the number of air spaces 20 formed inside the wavelength conversion element 11. Therefore, the number of bundled wavelength conversion members 12 is preferably nine or more and more preferably 25 or more.

Moreover, from the viewpoint of more effectively reducing the leakage of light from the side surfaces of the wavelength conversion element 11, the refractive index of the dispersion medium of the wavelength conversion member 12 (≈the refractive index of the wavelength conversion member 12) is preferably 1.45 or more and more preferably 1.55 or more.

The wavelength conversion element according to the ninth embodiment may be used as the wavelength conversion element in the light source 2 shown in FIG. 6.

REFERENCE SIGNS LIST 1,2 . . . light source
10 . . . light-emitting element
11 . . . wavelength conversion element
11a . . . element body
11a1 . . . light entrance surface
11a2 . . . light exit surface
11b . . . wavelength-selective filter layer
11c . . . reflection suppression layer
11d . . . reflective layer
11e . . . light entrance region
11f . . . light exit region
12 . . . wavelength conversion member
12L . . . first wavelength conversion portion
12H . . . second wavelength conversion portion
12a . . . light entrance surface
12b . . . light exit surface
12c to 12f . . . side surface
13,15,17 . . . reflective layer
14 . . . wavelength conversion section
16 . . . wavelength conversion section
18 . . . beam splitter
19 . . . substrate
20 . . . air space

The invention claimed is:

1. A wavelength conversion element having a light entrance surface and a light exit surface opposed to each other in a first direction, the wavelength conversion element comprising:
a first portion made of phosphor powder dispersed in a first dispersion medium made of high-temperature resin and constituting a first wavelength conversion portion extending from the light entrance surface to the light exit surface in the first direction; and
a second portion provided to extend from the light entrance surface to the light exit surface in the first direction and in contact with the first portion and containing a second dispersion medium made of high-temperature resin having a different refractive index from the first dispersion medium, wherein
the first portion is surrounded by the second portion, and light inside the first wavelength conversion portion is reflected at an interface between the first wavelength conversion portion and the second portion, and
the difference between the refractive index of the first dispersion medium and the refractive index of the second dispersion medium is 0.05 or more.

2. The wavelength conversion element according to claim 1, wherein the second portion further contains phosphor powder dispersed in the second dispersion medium and constitutes a second wavelength conversion portion.

3. The wavelength conversion element according to claim 1, wherein the number of the first portions provided and the number of the second portions provided are plural and the plurality of first portions and the plurality of second portions are arranged in a matrix.

4. The wavelength conversion element according to claim 1, wherein the phosphor powder is inorganic phosphor powder and the dispersion medium is glass or ceramic.

5. A light source comprising:
the wavelength conversion element according to claim 1; and
a light-emitting element for emitting excitation light of the phosphor powder to the light entrance surface of the wavelength conversion element.

6. The wavelength conversion element according to claim 1, wherein the first portion and the second portion are directly joined together.

7. A wavelength conversion element having a light entrance surface and a light exit surface opposed to each other in a first direction, the wavelength conversion element comprising:
a first portion made of phosphor powder dispersed in a first dispersion medium made of glass or ceramic and constituting a first wavelength conversion portion extending from the light entrance surface to the light exit surface in the first direction; and
a second portion provided to extend from the light entrance surface to the light exit surface in the first direction and in contact with the first portion and containing a second dispersion medium made of high-temperature resin having a different refractive index from the first dispersion medium, wherein
the first portion is surrounded by the second portion, and light inside the first wavelength conversion portion is reflected at an interface between the first wavelength conversion portion and the second portion.

8. The wavelength conversion element according to claim 7, wherein the first portion and the second portion are directly joined together.

9. The wavelength conversion element according to claim 7, wherein the difference between the refractive index of the first dispersion medium and the refractive index of the second dispersion medium is 0.05 or more.

10. A light source comprising:
the wavelength conversion element according to claim 7; and
a light-emitting element for emitting excitation light of the phosphor powder to the light entrance surface of the wavelength conversion element.

11. A wavelength conversion element having a light entrance surface and a light exit surface opposed to each other in a first direction, the wavelength conversion element comprising:
- a first portion made of phosphor powder dispersed in a first dispersion medium made of glass or ceramic and constituting a first wavelength conversion portion extending from the light entrance surface to the light exit surface in the first direction; and
- a second portion provided to extend from the light entrance surface to the light exit surface in the first direction and in contact with the first portion and containing a second dispersion medium made of glass or ceramic having a different refractive index from the first dispersion medium, wherein
- the first portion is surrounded by the second portion, and light inside the first wavelength conversion portion is reflected at an interface between the first wavelength conversion portion and the second portion.

12. The wavelength conversion element according to claim 11, wherein the first portion and the second portion are directly joined together.

13. The wavelength conversion element according to claim 11, wherein the difference between the refractive index of the first dispersion medium and the refractive index of the second dispersion medium is 0.05 or more.

14. A light source comprising:
- the wavelength conversion element according to claim 11; and
- a light-emitting element for emitting excitation light of the phosphor powder to the light entrance surface of the wavelength conversion element.

* * * * *